United States Patent [19]

Glatfelter

[11] Patent Number: 5,268,037

[45] Date of Patent: Dec. 7, 1993

[54] MONOLITHIC, PARALLEL CONNECTED PHOTOVOLTAIC ARRAY AND METHOD FOR ITS MANUFACTURE

[75] Inventor: Troy Glatfelter, Royal Oak, Mich.

[73] Assignee: United Solar Systems Corporation, Troy, Mich.

[21] Appl. No.: 886,151

[22] Filed: May 21, 1992

[51] Int. Cl.$^5$ .................... H01L 31/042; H01L 31/18
[52] U.S. Cl. .................................. 136/249; 136/244;
  136/256; 136/258; 136/246; 437/2; 437/4
[58] Field of Search .............. 136/244, 246, 249 MS,
  136/249 TJ, 256, 258 AM; 437/2–5, 51, 173, 205

[56] References Cited

U.S. PATENT DOCUMENTS

| | | | |
|---|---|---|---|
| 4,650,524 | 3/1987 | Kiyama et al. | 437/193 |
| 4,668,840 | 5/1987 | Kiyama et al. | 136/244 |
| 4,726,849 | 2/1988 | Murata et al. | 136/244 |
| 4,773,943 | 9/1988 | Yamaguchi et al. | 136/244 |
| 4,808,242 | 2/1989 | Murata et al. | 136/244 |
| 4,849,029 | 7/1989 | Delahoy | 136/249 |
| 4,865,999 | 9/1989 | Xi et al. | 437/2 |
| 4,956,023 | 9/1990 | Tsuge et al. | 136/244 |
| 4,981,525 | 1/1991 | Kiyama et al. | 136/244 |

*Primary Examiner*—Aaron Weisstuch
*Attorney, Agent, or Firm*—Krass & Young

[57] ABSTRACT

A monolithic array of photovoltaic devices includes a plurality of subcells electrically interconnected in a parallel relationship. The subcells are disposed upon a common, electrically conductive substrate and each includes an insulating region disposed upon the substrate and an electrode body disposed upon the insulating region. The subcells each include a photovoltaic semiconductor body disposed upon the electrode body and the array includes a continuous body of top electrode material disposed so as to cover each of the semiconductor bodies and to fill the space therebetween and establish electrical communication between the substrate and the semiconductor bodies. The substrate forms one terminal of the array and the conductive bodies are in electrical communication with a bus bar which forms the other terminal of the array. Also disclosed herein is a method for the fabrication of the array.

20 Claims, 3 Drawing Sheets

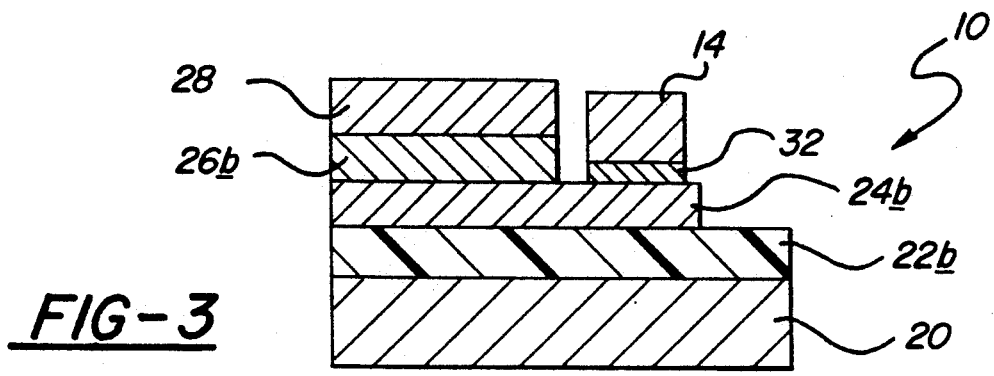
_FIG-3_
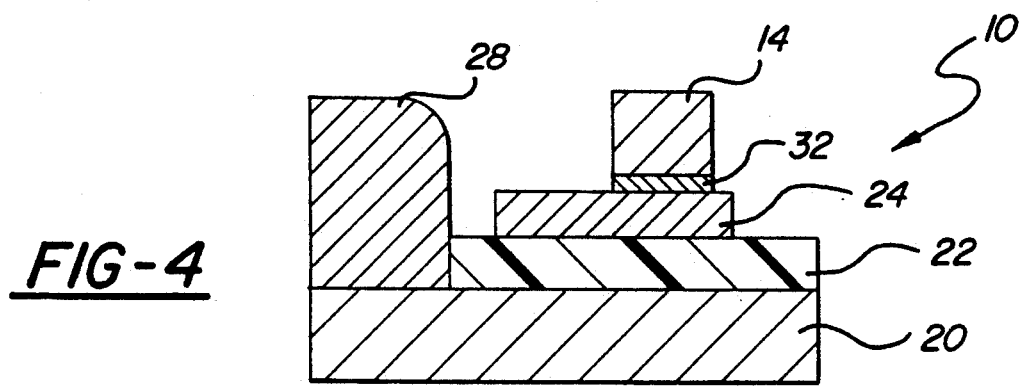
_FIG-4_
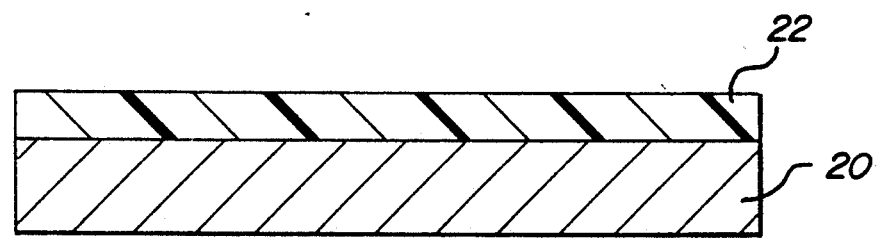
_FIG-5_
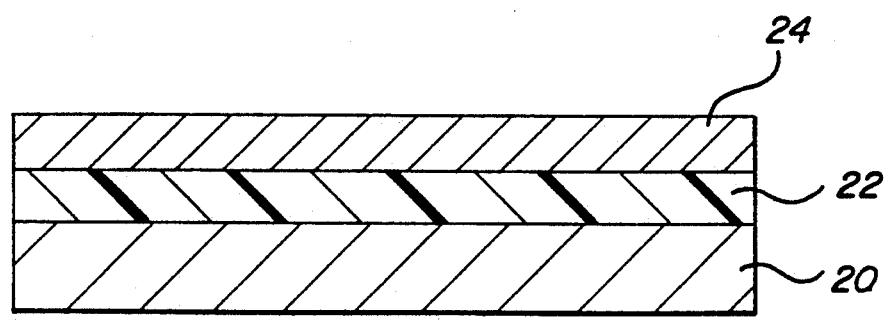
_FIG-6_

MONOLITHIC, PARALLEL CONNECTED PHOTOVOLTAIC ARRAY AND METHOD FOR ITS MANUFACTURE

FIELD OF THE INVENTION

This invention relates generally to semiconductor devices and more particularly to photovoltaic devices. Most specifically, the invention relates to an array of photovoltaic devices disposed upon a common, electrically conductive substrate in a parallel relationship.

BACKGROUND OF THE INVENTION

Photovoltaic devices provide a non-polluting, silent and reliable source of electrical power. Originally, photovoltaic devices were fabricated from crystalline material and, as a consequence, were expensive and restricted in size. Techniques have now been developed for the preparation of large area thin film semiconductor materials which may be advantageously fabricated into low cost, large area photovoltaic devices.

It is frequently desirable to subdivide large area devices into a plurality of small area devices disposed upon a common substrate. Such arrays are generally referred to as monolithic modules. The structure of these modules makes them more tolerant of defects in the photovoltaic material and allows for the selection of desired voltage and/or current outputs. In some instances the small area devices of a monolithic array are interconnected in a series arrangement so as to provide for an increased voltage. In other instances it is desirable to provide an array of devices disposed in parallel. A parallel connected array provides a constant voltage which is independent of area. Furthermore, the presence of a large number of small area devices in the array allows for localization of defective regions and such defects may be readily removed without effect upon the remainder of the device.

In any type of photovoltaic device it is desirable to minimize areas which are not photovoltaically active. Such dead areas include portions of the device covered by grid lines, bus bars, electrical interconnects, or other such current-carrying members. In the fabrication of monolithic arrays it is necessary to scribe away portions of the photovoltaically active material to provide the plurality of isolated subcells and such scribed areas are also photovoltaically inactive.

Laser scribing techniques are often employed in the fabrication of monolithic photovoltaic arrays since a laser can scribe precise, fine lines in the photovoltaic device for a fairly low cost, thereby minimizing the expense of device fabrication and maximizing active area. Problems encountered in connection with prior art laser scribing techniques are generally attributable to the high levels of localized heating produced by the laser beam. Such heating can cause metal electrodes to melt and short circuit the device. Also, the laser can induce unwanted crystallization of amorphous semiconductor materials, thereby increasing their electrical conductivity and creating shunted current paths which degrade device efficiency.

It will be appreciated that it is desirable to eliminate, or minimize photovoltaically dead areas such as gridlines, bus bars, and other such current-carrying structures as well as scribe lines so as to increase active area and hence cell efficiency. It is also desirable to eliminate shunting, short circuiting, or other such damage occasioned by laser scribing of the layers of a photovoltaic device.

The present invention provides an improved configuration of monolithic array in which active area is minimized and the layers are disposed so that molten metal flow, semiconductor crystallization, and other such artifacts of the laser scribing process are significantly decreased. The present invention provides for the manufacture of a large area, monolithic array of interconnected small area photovoltaic devices. The array is economical to fabricate and manifests a high efficiency. These and other advantages of the present invention will be readily apparent from the drawings, discussion and description which follow.

BRIEF DESCRIPTION OF THE INVENTION

There is disclosed herein a monolithic photovoltaic array which is comprised of a plurality of subcells electrically interconnected in a parallel relationship. The array includes an electrically conductive substrate having a plurality of insulating regions disposed thereupon so that adjoining regions as separated by a distance of $W_1$. The array further includes a plurality of electrode bodies, each of which is disposed on a corresponding one of the insulating regions. Each electrode body has a width which is less than the width of the insulating region upon which it is disposed. Adjoining electrode bodies are separated by a distance $W_2$ which is greater than the distance $W_1$. The array further includes a plurality of photovoltaic semiconductor bodies, each of which is disposed atop a corresponding one of the electrodes so as to cover substantially all of the width of the electrode. The array also includes a layer of top electrode material disposed so as to establish a continuous electrical connection between the plurality of semiconductor bodies and the substrate so that the substrate provides a first electrical terminal of the array. The array also includes means for electrically interconnecting the electrode bodies so as to provide a second terminal of the array. In one particular embodiment, the insulating regions are comprised of an organic polymeric material disposed upon the substrate. In another embodiment, the insulator is an inorganic material which is disposed on the substrate. In another embodiment, the substrate is metal and the insulating regions are comprised of an electrically insulating component derived from the metal of the substrate. In other embodiments the metallic bodies include a highly reflective surface of silver or the like and may also be textured so as to increase light scattering therefrom.

In one preferred embodiment the semiconductor bodies comprise a plurality of silicon alloy-based semiconductor bodies. The top electrode material is preferably a transparent conductive oxide material and may optionally include a plurality of beads of electrically conductive material which are disposed between adjoining insulating regions.

The present invention also includes a method for the fabrication of the array, which method includes the steps of providing an electrically conductive substrate, providing an electrically insulating layer of material on the substrate, depositing a layer of electrically conductive material atop the insulating material and scribing through portions of the layer of electrically conductive material so as to expose select portions of the insulating coating and to create a plurality of spaced apart, electrically conductive electrode bodies which are disposed in a side-by-side relationship so that each body is separated from adjoining bodies by a distance $W_2$. The method includes the further step of depositing a photovoltaic, semiconductor body atop the substrate so as to form a continuous layer having a first surface covering the electrode bodies and the exposed portions of insulating material, and scribing the semiconductor body and insulating material in the region between the electrode bodies by forming a scribe line therethrough having a width of $W_1$ which is less than $W_2$ so as to expose a portion of the substrate material. The method includes the further steps of depositing a continuous layer of electrically conductive material so as to cover substantially all of a second surface of each of the photovoltaic bodies and the exposed portions of substrate material so that electrical communication between the substrate and the second surface of the photovoltaic bodies is established. In this manner, the substrate provides a first electrical terminal of the array. The method includes the final step of providing means for electrically interconnecting the electrode bodies, which means is operative to provide a second electrical terminal of the array.

BRIEF DESCRIPTION OF THE DRAWINGS

FIG. 3 is a cross-sectional view of the module of FIG. 1 taken along line III—III;

FIG. 4 is a cross-sectional view of the module of FIG. 1 taken along line IV—IV;

FIGS. 5-9 are cross-sectional views of a photovoltaic module generally similar to that of FIG. 2 taken at different stages in the processing thereof and illustrating the various steps in the manufacture of the module.

DETAILED DESCRIPTION OF THE INVENTION

Figure 1:
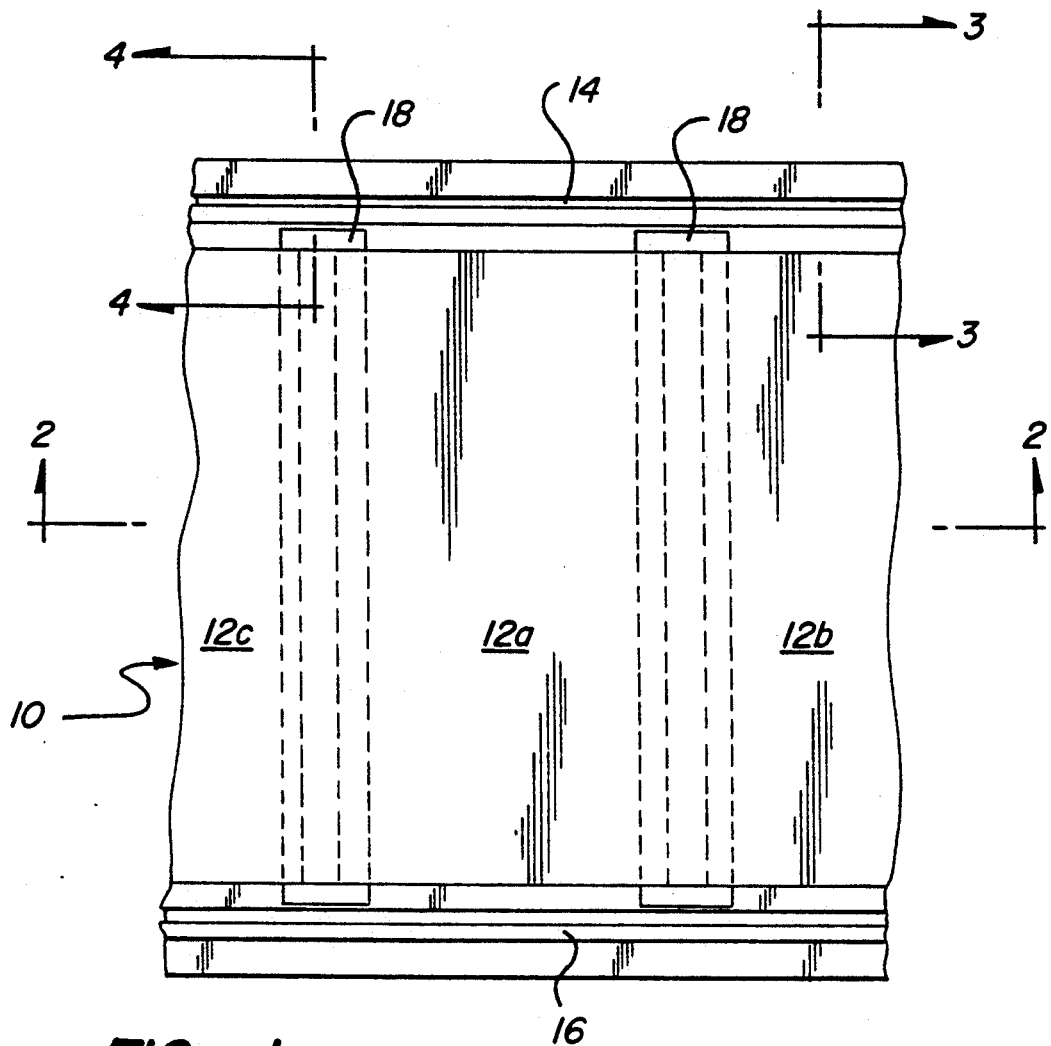
FIG. 1 is a top plan view of a portion of a photovoltaic module structured in accord with the principles of the present invention.

Referring now to FIG. 1, there is shown a top plan view of a portion of a module 10 structured in accord with the principles of the present invention. The module 10 includes a plurality of subcells interconnected in an electrically parallel relationship and disposed upon a common substrate. Shown in FIG. 1 is the subcell 12a and portions of adjoining subcells 12b and 12c. It is to be understood that the module may comprise a number of such subcells, and since the subcells are electrically connected in a parallel relationship, the voltage produced by the module will be independent of module size. Also apparent from the FIG. 1 view are bus bars 14 and 16 which are electrically connected with one of the terminals of each of the subcells 12. It Will be noted that each subcell 12 is separated from its neighboring subcells by scribe lines 18 which will be described in greater detail hereinbelow. The scribe lines are shown in phantom outline since they are covered by the top electrode of the module 10, which electrode is typically formed from a transparent conductive oxide material.

The size of the module is arbitrary, and as noted hereinabove, voltage is independent of module size in this configuration. Also, the subcells 12 may be of varying dimensions in accord with the principles of the present invention. In one particularly preferred embodiment, the width dimension of the subcells (i.e., the scribe line to scribe line distance) is on the order of 1 cm., whereas the length dimension (i.e., the dimension parallel to the scribe lines) is approximately 30 cm. It will be noted that the module 10 of FIG. 1 does not include any current-collecting grid or other such structures atop the active area of the subcells 12. The particular configuration of the module 10 of the instant invention minimizes the path photovoltaically generated current has to take to traverse the subcells 12 and hence the need for such structures is eliminated.

Figure 2:
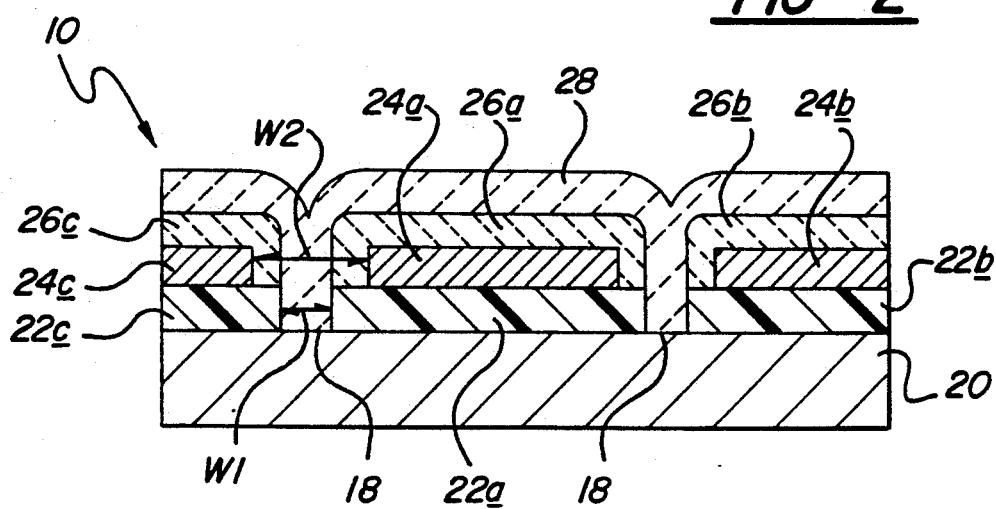
FIG. 2 is a cross-sectional view of the module of FIG. 1 taken along line II—II.

Referring now to FIG. 2 there is shown a cross-sectional view of the module 10 of FIG. 1 taken along line II—II. The device 10 includes an electrically conductive substrate 20 which in one preferred embodiment is a metallic substrate fabricated from stainless steel, brass, copper, aluminum, or any other such low cost metal having good electric conductivity. In other embodiments, the substrate 20 comprises an electrically insulating body such as glass, polymers, and the like and is provided with an electrically conductive coating of a metal, metal oxide or similar material. Disposed atop the substrate are a plurality of insulating regions, three of which are shown here as 22a, 22b, and 22c. The insulating regions may be formed of an organic polymeric material such as a polyimide. One particular polyimide having utility in the present invention is a material sold under the trade name Kapton by the Dow Chemical Company. The insulating regions may also be formed from an inorganic material such as silicon oxide or silicon nitride. In some instances the insulating regions may be derived from the substrate material itself. For example, if substrate 20 is formed of aluminum, the insulating regions 22 may be advantageously provided by anodizing the surface of the aluminum substrate 20.

Disposed atop each of the insulating regions 22 is an electrode body 24 and illustrated herein are three such bodies 24a, 24b, and 24c. The electrode bodies 24 are generally fabricated from a metallic material, although in some instances transparent conductive oxide materials may be employed. In one particularly preferred embodiment, the electrode bodies 24 are fabricated from a highly reflective metal which enhances the efficiency of the photovoltaic device by directing non-absorbed light back through the overlying photovoltaic body to increase light absorption. As is well known in the art, the reflective surface of the electrode 24 may be texturized so as to increase light scattering. The electrodes 24 may be fabricated from a highly reflective metal such as silver or copper, or they may be composite electrodes fabricated from a layer of a less reflective metal covered with a layer of silver or copper.

Disposed atop the electrode bodies 24 are a plurality of photovoltaic bodies 26 shown herein as 26a, 26b, and 26c. The photovoltaic body 26 operates to absorb incident photons and generate an electrical current in response thereto. The photovoltaic body 26 may comprise any one of a number of photovoltaic materials such as silicon, silicon alloys, gallium arsenide, copper indium diselenide, cadmium sulfide among others. One particularly preferred photovoltaic material comprises thin film alloys of silicon and/or silicon-germanium. These materials may be fabricated into P-I-N-type photovoltaic devices wherein a layer of substantially intrinsic alloy material is sandwiched between oppositely doped semiconductor layers. In some instances a plurality of P-I-N-type devices may be stacked atop one another to provide increased photovoltaic conversion efficiency. Within the context of this disclosure, the term "photovoltaic body" shall include any layer or aggregation of layers of semiconductor material which generates a flow of electrical current in response to the absorption of illumination thereby.

The module further includes a layer of top electrode material 28 disposed so as to establish a continuous electrical connection between the semiconductor bodies 26 and the substrate 20. The layer of top electrode material 28 covers the semiconductor bodies 26 and extends through the scribe lines 18 therebetween to contact the substrate. The top electrode material is most preferably a layer of transparent conductive material, typically a transparent conductive metal oxide such as indium oxide, tin oxide, zinc oxide, or combinations thereof.

It will be noted that the insulating body 22, electrode body 24, and semiconductor body each cooperate, together with the overlying portion of top electrode material 28, to define the subcells 12 comprising the array 10. Each subcell is separated from an adjoining subcell by a scribe line 18 as noted hereinabove and is more apparent from the drawing of FIG. 2, the scribe line 18 comprises two portions. A first portion having a width $W_1$ separates adjoining insulating regions, for example 22a and 22c. A second portion of the scribe line 18 has a width $W_2$ which is greater than $W_1$ and separates adjoining electrode bodies, for example electrode bodies 24a and 24c in FIG. 2. This dual scribe line configuration provides a module geometry wherein the width of the electrode body is less than the width of the insulating region upon which it is disposed. It will also be noted from the Figure that the semiconductor body 26 is disposed so as to cover substantially all of the width of the electrode body.

In the module, the highly conductive electrode bodies are completely surrounded by the semiconductor material 26 which has a lower electrical conductivity. The electrode bodies 24 communicate with one surface of the semiconductor body and each forms an electrode of the particular subcell with which it is associated. The other surface of the photovoltaic body is contacted by the top electrode material 28 and a continuous current path is established through the top electrode material to the substrate 20 which thus forms a common terminal for all of the subcells of the array. It will be appreciated that interconnection of the electrode bodies establishes a parallel array with the substrate providing one terminal of the array and the interconnect member joining the electrode bodies, providing the other terminal.

Referring now to FIG. 3, there is shown a cross-sectional view of the module 10 of the present invention taken along line III—III and illustrating the edge of the module and the bus bar structure. Shown in the figure is the substrate 20 with an insulating region 22b thereupon. Atop the insulating region 22b is the electrode body 24b. Also shown is a portion of the semiconductor body 26b and the top electrode material 28. It will be noted that a portion of the electrode body 24b extends across the insulating body 22b and is spaced apart from the semiconductor body 26b and top electrode material 28. This portion of the electrode body 24 has a bus bar 14 affixed thereto by an electrically conductive material 32 such as solder, electrically conductive adhesive, a weld, or the like.

Referring now to FIG. 4, there is shown a cross-sectional view of the module 10 of FIG. 1 taken along lines IV—IV and illustrating the structure of the module 10 in the region proximate one of the grooves 18 and the edge thereof. Shown is the substrate 20 with a portion of insulating material 22 thereatop. This particular portion of insulating material 22 is not associated with any particular subcell but is a portion of a thin strip of insulating material running along the entirety of the edge of the module 10. Atop the insulating material 22 is a body of electrically conductive material 24 which also is not associated with any particular subcell but is a portion of a thin strip of material remaining after scribing of the subcells. Shown atop the conductive material 24 is the bus bar 14 and conductive material 32 as noted hereinabove. Also shown in the FIG. 4 view is a portion of the top electrode material 28. As will be seen from FIGS. 3 and 4, the bus bar 14 is in electrical communication with the electrode bodies 24 and is electrically isolated from the top electrode material 28 and the substrate 20. In this manner, the substrate provides a first terminal of the array and the bus bar a second.

In the array, the substrate 20 is in electrical communication with each of the photovoltaic subcells and forms the first terminal of the array. The electrode bodies 24 are all in contact with a bus bar as illustrated at 14 in FIGS. 3 and 4. As is evidenced from these figures as well as FIG. 1, the body of insulating material 22 is extended to the edge of the substrate whereas the semiconductor material 26 and top electrode 28 do not extend completely to the edges. When the scribing takes place, the scribe lines are configured so that the scribe through the conductive material 24 also extends to a point short of the edge of the substrate 20 and the scribe through the semiconductor body and insulating material extends to a point somewhat short of the scribe through the conductive material. In this manner, the structure of FIGS. 3 and 4 is achieved and thereby provides space for attachment of the bus bar 30. It will be noted from FIG. 1 that the module preferably includes a pair of bus bars 14 and 16 at opposite edges thereby further minimizing current paths.

The method of fabrication of the arrays of the present invention is illustrated in FIGS. 5-9. As shown in FIG. 5 an electrically conductive substrate 20 has an electrically insulative coating 22 applied thereto. As noted previously, the substrate may comprise a body of metal or it may comprise a layer of glass, ceramic, or polymer having an electrically conductive coating thereupon. The insulating material 22 may comprise a separate body of a material such as a body of polymeric or inorganic material applied by conventional techniques such as solvent coating, sputtering, evaporation, and the like, or it may comprise a body of material derived from the treatment of the substrate 20 as, for example, by anodizing, nitriding or the like. In the subsequent step, as illustrated in FIG. 6, a layer of electrically conductive material 24 is deposited atop the layer of insulating material 22. The layer of conductive material is preferably a layer of metal and may be deposited by conventional techniques such as evaporation, sputtering, plating, or thermal decomposition of metallic compounds. As noted hereinabove, a layer of electrically conductive material may comprise a single layer or a plurality of layers.

Figure 7:
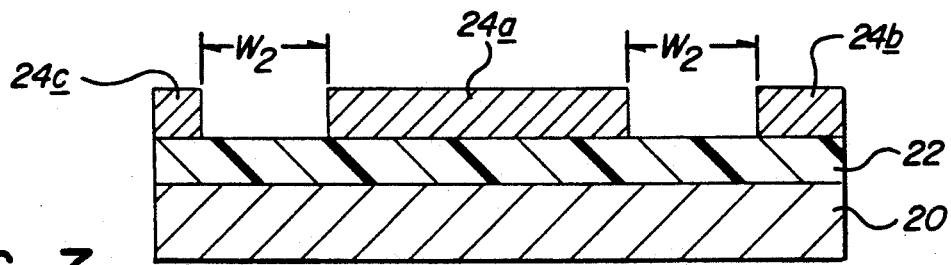

In the next step, as illustrated in FIG. 7, the electrically conductive material is scribed so as to create a plurality of spaced apart electrode bodies disposed in a side-by-side relationship so that each body is separated from adjoining bodies by a distance of $W_2$. As shown in the figure, the scribing step results in the formation of electrode bodies 24a, 24b, and 24c. Scribing is most preferably accomplished by the use of a laser with a neodymium-YAG laser being preferred. In general, the width $W_2$ of the scribe lines is within the range of 25-100 microns. It is to be understood that the invention may be practiced with scribing methods other than laser scribing. For example, scribing may be accomplished by a high pressure water jet, photoetching techniques, or the like. It is one important feature of the present invention that scribing of the metal takes place prior to the deposition of the semiconductor layers, thereby eliminating the danger of short circuits resultant from the flow of stray molten metal.

Figure 8:
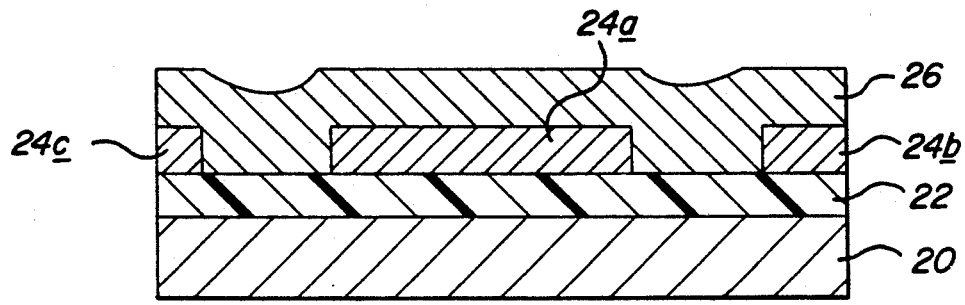

FIG. 8 depicts a subsequent step in the fabrication of the device wherein a photovoltaic semiconductor body 26 is deposited atop the substrate so as to form a continuous layer having a first surface covering both the electrode bodies, 24a, 24b, and 24c, and the exposed portions of insulating material 22 therebetween. As noted above, the semiconductor body 26 typically comprises a plurality of semiconductor layers which cooperate to provide a photogenerated current in response to the absorption of light. The layers may be deposited by techniques such as plasma glow discharge deposition, chemical vapor deposition, sputtering, evaporation, and the like.

Figure 9:
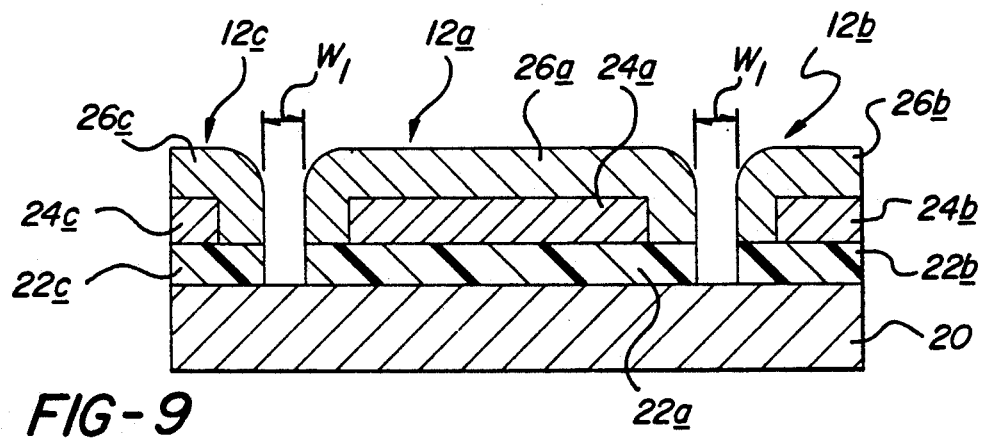

In the next step, as illustrated in FIG. 9, the semiconductor body and subjacent insulating material is scribed through in the region between the electrode bodies. Scribing again is typically accomplished by a laser such as the aforementioned neodymium/YAG laser or by chemical etching, a water jet, mechanical scribing, or the like. The width of the scribed region is $W_1$ and is less than the width of the first scribe $W_2$. It is notable that both scribe lines are superimposed, thereby maximizing the active area of the photovoltaic device. As a result of the scribing, the semiconductor layer 26 is subdivided into a plurality of semiconductor bodies 26a, 26b, 26c and the insulating coating 22 is subdivided into a plurality of insulating regions 22a, 22b, 22c. In this manner there are provided a plurality of discrete photovoltaic subcells 12a, 12b, 12c disposed upon a common substrate 20. Each subcell, (for example, subcell 12a) includes a bottom electrode 24a and a photoactive semiconductor body 26a and is disposed upon an insulating region 22a. The subcell of FIG. 9 is still lacking a top electrode and in the final deposition step, a continuous layer of electrically conductive material is deposited upon the device to cover substantially all of the top surface of each of the photovoltaic bodies 26a, 26b, 26c and the exposed portions of substrate material 20 so as to establish a common electrical connection therebetween. The completed device is substantially as shown in FIG. 2.

The method and structure of the present invention provides for a photovoltaic device having very large active areas. The width of the active regions can be twice that of prior art laser scribed modules since current collection from the second surface of the photovoltaic body can occur from both edges. Also, the width of the scribed region is half that of prior art laser scribed modules since the scribe lines subdividing the insulating body and the electrode body are superimposed. As a result, the ratio of the scribed area to the active area is one-fourth that of a conventional laser scribed module.

The methodology of the present invention, wherein the metal is scribed first, reduces shorts and shunts which are due to the flow of molten metal. Unwanted crystallization of the semiconductor material, which can also lead to shorts and shunts is minimized by the present scribing process. Still another advantage of the present invention is that the scribing of the semiconductor body and insulating layer takes place in a single step, thereby eliminating the time and expense of multiple scribes.

The present invention may be practiced in connection with a variety of semiconductor and electrode materials. While the device has primarily been described as including a metallic substrate, metallic electrode bodies and a transparent body of top electrode material, various other configurations are possible. For example, the substrate may be fabricated from glass which has an electrically conductive coating thereupon. The insulating regions may comprise portions of an insulating material disposed atop the conductive coating of the glass or they may comprise regions wherein the conductive coating is removed. In an embodiment of this type, the electrode bodies disposed atop the insulating regions are also transparent and, in some instances, may be discrete bodies of material or they may be formed by appropriately patterning the conductive coating on the glass. In an inverted configuration of this type, the top electrode material will preferably be a metallic material.

Figure 10:
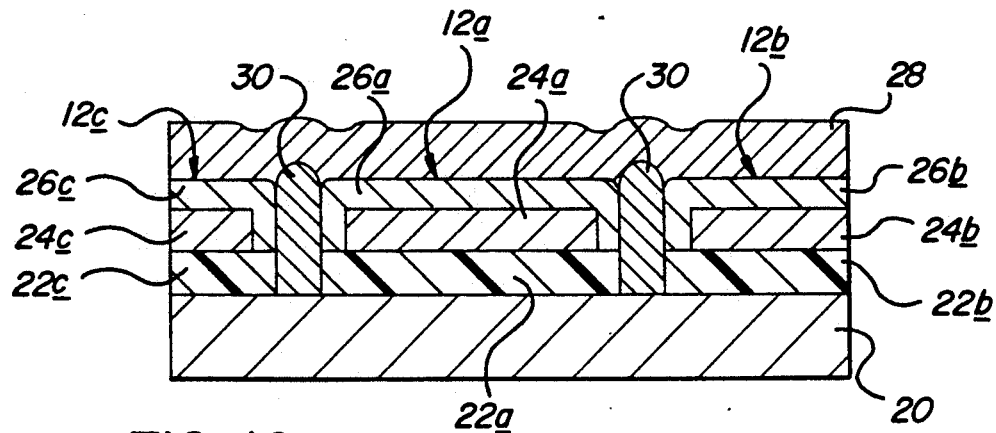
FIG. 10 is a cross-sectional view of another embodiment of module structured in accord with the principles of the present invention.

Referring now to FIG. 10, there is shown yet another embodiment of the present invention. Depicted in FIG. 10 is a cross-sectional view of an array generally similar to that of FIG. 2 and like structures will be referred to by like reference numerals. The array is disposed upon an electrically conductive substrate 20 and includes a plurality of subcells 12a, 12b, 12c. Each subcell includes an insulating region 22a, 22b, 22c, an electrode body 24a, 24b, 24c, a semiconductor body 26a, 26b, 26c as well as a common body of top electrode material 28. The module of FIG. 10 further includes beads of electrically conductive material 30 disposed between adjacent subcells. The beads 30 fill the spaces therebetween and assure that the body of top electrode material 28 will establish good electrical communication with the substrate 20. The beads of electrically conductive material may comprise a silver-loaded paste, a body of metallic material or the like.

In view of the foregoing it is clear that the invention may be practiced in a variety of configurations and employing a number of steps different from those depicted and described herein. All of such variations and modifications are within the scope of the invention. The foregoing drawings, discussions and descriptions are meant to be illustrative of particular embodiments of the invention and not meant to be limitations upon the practice thereof. It is the following claims, including all equivalents, which define the scope of the invention.

I claim:

1. A monolithic photovoltaic array comprised of a plurality of sub-cells electrically interconnected in a parallel relationship, said array comprising:
   an electrically conductive substrate;
   a plurality of insulating regions disposed on said substrate so that adjoining regions are separated by a distance of $W_1$;
   a plurality of electrode bodies, each disposed on a corresponding one of said insulating regions, each electrode body having a width which is less than a width of the insulating region upon which it is disposed, said electrode bodies being disposed so that edges of electrode bodies on adjoining insulating regions are separated by a distance $W_2$ which is greater than the distance $W_1$;

a plurality of photovoltaic semi-conductor bodies, each disposed atop a corresponding one of said electrode bodies so as to cover substantially all of the width and edges of said electrode body;

a layer of top electrode material disposed so as to establish a continuous electrical connection between said plurality of semi-conductor bodies and the substrate, so that the substrate provides a first electrical terminal of said array; and means for electrically interconnecting said electrode bodies, said means operative to provide a second terminal of said array.

2. An array as in claim 1, wherein said insulating regions are comprised of an organic polymeric material.

3. An array as in claim 1, wherein said insulating regions are comprised of an inorganic material.

4. An array as in claim 1, wherein said substrate is metal.

5. An array as in claim 4, wherein said insulating regions are comprised of an electrically insulating component derived from the metal comprising the substrate.

6. An array as in claim wherein said plurality of insulating regions comprises a plurality of spaced-apart strips of insulating material disposed in a parallel relationship.

7. An array as in claim 1, wherein said plurality of electrode bodies comprise a plurality of metallic bodies.

8. An array as in claim 7, wherein said metallic bodies each include a highly reflective surface.

9. An array as in claim 7, wherein said metallic bodies each include a textured surface.

10. An array as in claim 1, wherein each of said plurality of semi-conductor bodies includes a layer of a silicon alloy semi-conductor material.

11. An array as in claim 1, wherein said each of said plurality of semi-conductor bodies comprises a layer of substantially intrinsic semi-conductor alloy material sandwiched between oppositely doped semi-conductor layers so as to define a P-I-N-type photovoltaic structure.

12. An array as in claim 11, wherein each of said plurality of semi-conductor bodies comprises a stacked, tandem P-I-N-type photovoltaic device.

13. An array as in claim 1, wherein said layer of top electrode material comprises a transparent conductive oxide material.

14. An array as in claim 1, wherein said layer of top electrode material comprises a single homogeneous layer of material.

15. An array as in claim 1, wherein said layer of top electrode material comprises a composite layer having a bead of electrically conductive material disposed between adjoining insulating regions and in contact with the substrate and a body of electrode material disposed in contact with the semi-conductor body and the bead.

16. A method of fabricating a monolithic photovoltaic array comprised of a plurality of sub-cells electrically interconnected in a parallel relationship, said method including the steps of:

providing an electrically conductive substrate;

providing an electrically insulating coating on said substrate;

depositing a layer of electrically conductive material atop the insulating material;

scribing through portions of the layer of electrically conductive material so as to expose selected first portions of the insulating coating and to create a plurality of spaced apart, electrically conductive, electrode bodies which are disposed in a side-by-side relationship with an edge of each body separated from an edge of adjoining bodies by a distance $W_2$;

depositing a photovoltaic, semi-conductor material atop the substrate so as to form a continuous layer having a first surface covering the electrode bodies, the edges thereof and the first exposed portions of insulating material therebetween;

scribing the semi-conductor body and the insulating material in the region between the electrode bodies by forming a scribe line therethrough having a width of $W_1$ which is less than $W_2$, so as to expose second portions of the substrate material and to keep the edges of the electrode bodies covered;

depositing a continuous layer of electrically conductive material so as to cover substantially all of a second surface of each of the photovoltaic bodies and the exposed second portions of substrate material so that electrical communication between the substrate and the second surface of the photovoltaic bodies is established whereby said substrate provides a first electrical terminal of said array; and electrically interconnecting the electrode bodies with interconnect means, said means operative to provide a second electrical terminal of said array.

17. A method as in claim 16, wherein the step of scribing the layer of electrically conductive material comprises laser scribing the layer of electrically conductive material.

18. A method as in claim 16, wherein the step of scribing the semiconductor body and insulating material comprises laser scribing the semiconductor body and insulating material.

19. A method as in claim 16, wherein the step of depositing a layer of electrically conductive material atop the insulating material comprises the step of depositing a layer of metal atop the insulating material.

20. A method as in claim 19, wherein the step of depositing a layer of metal comprises depositing a layer of metal having a highly reflective surface.

* * * * *

UNITED STATES PATENT AND TRADEMARK OFFICE
CERTIFICATE OF CORRECTION

PATENT NO. : 5,268,037
DATED : December 7, 1993
INVENTOR(S) : Glatfelter, Troy

It is certified that error appears in the above-indentified patent and that said Letters Patent is hereby corrected as shown below:

```
Claim 6, column 9, line 25 of the Patent
   after "claim" insert --1--
```

Signed and Sealed this

Third Day of May, 1994

BRUCE LEHMAN

*Attest:*

*Attesting Officer*     Commissioner of Patents and Trademarks